United States Patent
Dufrene

(10) Patent No.: US 8,078,133 B2
(45) Date of Patent: Dec. 13, 2011

(54) REDUCTION OF GAIN SWITCHING INDUCED PHASE JUMPS IN HIGH DYNAMIC RANGE DOWNCOVERSION MIXERS

(75) Inventor: Krzysztof Dufrene, Plesching (AT)

(73) Assignee: Infineon Technologies AG, Neubiberg (DE)

( * ) Notice: Subject to any disclaimer, the term of this patent is extended or adjusted under 35 U.S.C. 154(b) by 410 days.

(21) Appl. No.: 12/427,535

(22) Filed: Apr. 21, 2009

(65) Prior Publication Data

US 2010/0265008 A1    Oct. 21, 2010

(51) Int. Cl.
*H04B 1/26* (2006.01)

(52) U.S. Cl. ............... 455/323; 455/232.1; 455/334
(58) Field of Classification Search ............... None
See application file for complete search history.

(56) References Cited

U.S. PATENT DOCUMENTS

2009/0258623 A1* 10/2009 Connell et al. .......... 455/234.1
2009/0258626 A1* 10/2009 Yamada et al. .......... 455/253.2

* cited by examiner

*Primary Examiner* — Long Nguyen
(74) *Attorney, Agent, or Firm* — Lee & Hayes, PLLC

(57) ABSTRACT

A system and method for minimizing phase jumps in an output signal.

20 Claims, 5 Drawing Sheets

REDUCTION OF GAIN SWITCHING INDUCED PHASE JUMPS IN HIGH DYNAMIC RANGE DOWNCOVERSION MIXERS

BACKGROUND

In low-voltage receivers, passive current switching mixers with operational amplifiers based loads offer wide dynamic range characteristics. 1/f noise contribution is reduced in comparison with traditional active Gilbert cell mixers. Further, the active operational amplifier based load offers rail-to-rail signal processing capability of both wanted and interfering signals, improving mixer blocking performance due to clipping effects. Capacitors are often placed at the current interface between the switching stage of the mixer and the operational amplifier based load to further improve the dynamic range. However, the presence of capacitors at the switching stage in conjunction with a limited gain-bandwidth product of the operational amplifier may result in phase jumps.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical items.

DETAILED DESCRIPTION

The present disclosure describes a configurable interface between a mixer switching stage and a mixer active load module. Many specific details are set forth in the following description and in FIGS. 1-4 to provide a thorough understanding of various implementations. One skilled in the art will understand, however, that the subject matter described herein may have additional implementations, or that the concepts set forth may be practiced without several of the details described in the following description. More specifically, the interface between the mixer switching stage and the mixer active load module is configurable to allow a reduction of phase jumps in transfer characteristics during gain switching events.

System 100

Figure 1:
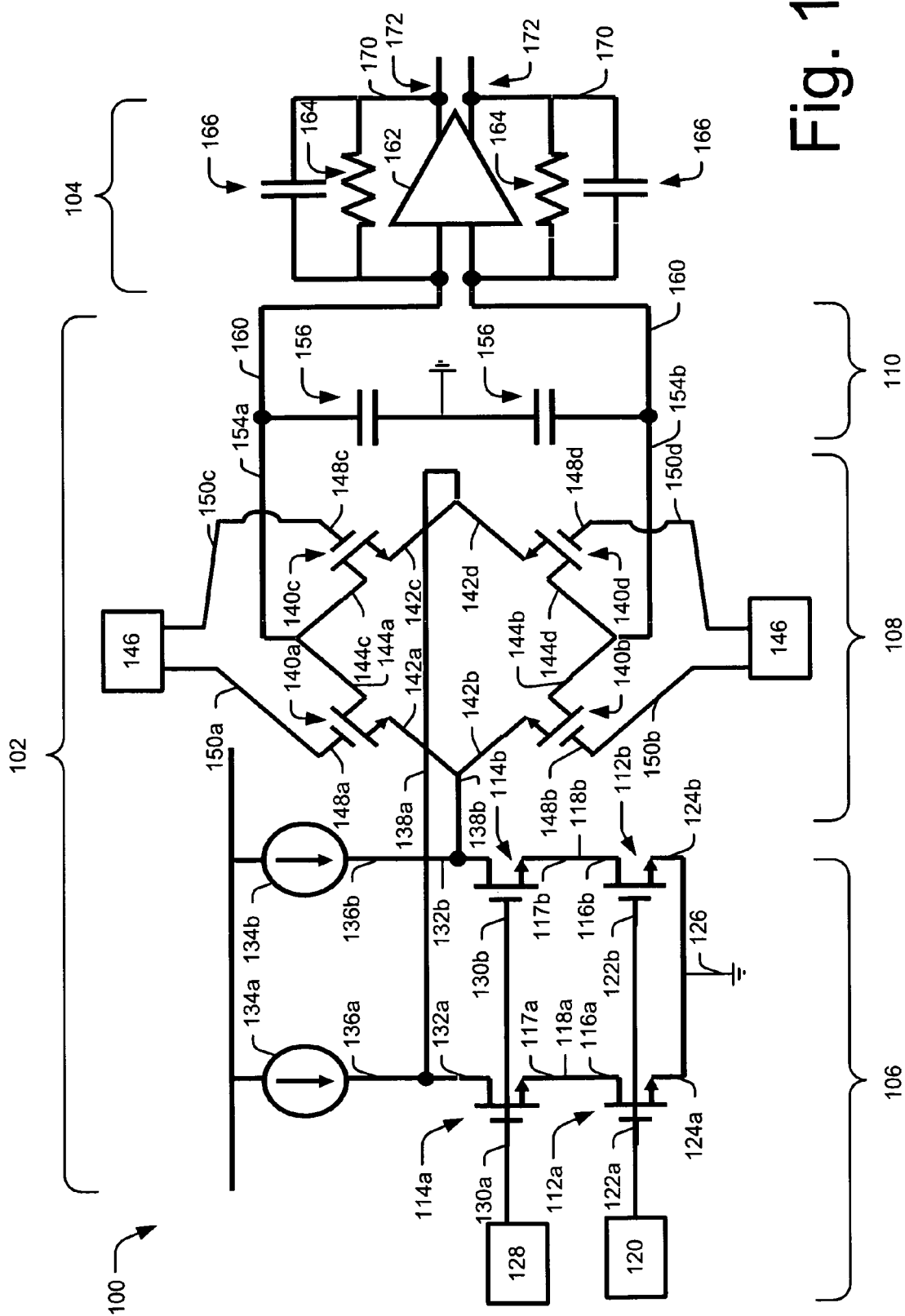
FIG. 1 is a diagram of a system overview of a mixer with a load module.

FIG. 1 shows an overview of a system 100 of a mixer portion 102 and a load portion 104. Mixer portion 102 comprises an input portion 106, passive switching stage 108 and interface 110. Mixer portion 102 downcoverts a received signal, described further below.

Input Portion 106 of Mixer Portion 102

Input portion 106 of mixer portion 102 receives a differential input voltage signal and outputs a differential current signal. More specifically, input portion 106 comprises 2 pairs of transistors 112a-b and 114a-b. Transistors 112 are connected to transistors 114, and more specifically, a drain terminal 116 of transistors 112 is connected to a source terminal 117 of transistors 114, with a path 118 being established therebetween.

An input voltage source 120 is connected to a gate (control) terminal 122 of transistors 112. Input voltage source 120 provides the differential input voltage signals $V_{rf+}$ and $V_{rf-}$ at gate terminals 122a and 122b, respectively. In a further implementation, input voltage signal $V_{rf}$ may be received via a communications network, including but not limited to GSM, UMTS, LTE (1.4 MHz, 3 MHz, 5 MHz, 10 MHz, 15 MHz, and 20 MHz). Source terminals 124 of transistors 112a are connected to a ground terminal 126. To that end, at drain terminals 116a and 116b of transistors 112, a current signal $I_{rf1+}$ and $I_{rf1-}$ is outputted, respectively, along paths 118a and 118b.

An input voltage source 128 is connected to a gate terminal 130 of transistors 114. Input voltage source 128 provides a biasing voltage signal $V_b$ at gate terminals 130. Drain terminals 132 of transistors 114 are connected to current sources 134, with a path 136 being established therebetween. Current sources 134 provide a common mode biasing current $I_b$ along paths 136, with current $I_b$ flowing through transistors 112 and 114 to ground terminal 126.

Input portion 106 is connected to passive switching stage 108 via path 138, described further below. To that end, as a result of current source 136 providing biasing current $I_b$ having a common mode component only, current signal $I_{rf2+}$ and $I_{rf2-}$ are outputted along paths 138a and 138b, respectively.

Passive Switching Stage 108 of Mixer Portion 102

Passive switching stage 108 mixes the current signal $I_{rf2}$ and outputs a signal comprising high-frequency upconverted products and low-frequency downcoverted products. More specifically, switching stage comprises 4 transistors 140a, 140b, 140c, and 140d. Source terminals 142 of transistors 140a and 140b are connected together and source terminals 142 of transistors 140c and 140d are connected together. Further, drain terminals 144 of transistors 140a and 140c are connected together and drain terminals 144 of transistors 140b and 140d are connected together.

An input local differential oscillator (LO) 146 is connected to gate terminals 148 of transistors 140, with a path 150 being established therebetween. For simplicity of illustration, the LO 146 is shown as two separate modules; in practice, the LO 146 may alternatively be a single module. Input local differential oscillator 146 provides a voltage signal $V_{lo+}$ and $V_{lo-}$ along path 150. More specifically, LO 146 provides signal $V_{lo+}$ to gate terminals 148a and 148d along paths 150a and 150d, respectively; and LO 146 provides signal $V_{lo-}$ to gate terminals 148b and 148c along paths 150b and 150c. Voltage signal $V_{lo}$ is a square wave signal toggling between 0 volts and VDD (supply voltage) with a 50% duty cycle.

To that end, passive switching stage 108 receives current signal $I_{rf2}$ along path 138. By driving gate terminals 148 of transistors 140 with signal $V_{lo}$, current $I_{rf2}$ is effectively multiplied by a square wave signal toggling between −1 and 1 to produce an output signal $I_{mixer}$ along path 154, described further below. Output signal $I_{mixer}$ comprises a high-frequency upconverted products portion and a low-frequency downconverted products portion.

Interface 110 of Mixer Portion 102

Interface 110 attenuates the high-frequency upconverted products from output signal $I_{mixer}$. More specifically, interface 110 comprises capacitors 156. Capacitors 156 are connected between drain terminals 144 of transistors 140a/140c and drain terminals 144 of transistors 140b/140d via path 154. Capacitors 156 attenuate the high-frequency upconverted products from output signal $I_{mixer}$ while allowing low-frequency downcoverted products to be outputted to load portion 104 via path 160, described further below.

Load Portion 104

Load portion 104 is the active load of system 100. Load portion 104 comprises an operational amplifier (op-amp) 162, resistors 164, and capacitors 166. As shown, resistors 164 and capacitors 166 are in a parallel connection; however, any implementation of resistors 164 and capacitors 166 may be employed. Load portion 104 is connected to capacitors 156 and receives output signal $I_{mixer}$ via path 160. Output signal $I_{mixer}$ is subjected to the impedance of resistors 164 and capacitors 166, establishing output load signal $I_{out}$ along path 170. Further, a voltage $V_{out}$ is established at node 172.

Gain Switching Induced Phase Jumps in Load Signal 168

To improve a dynamic range of system 100, as mentioned above, capacitors 156 of interface 110 attenuate the high-frequency upconverted products from output signal $I_{mixer}$. Further, capacitors 156 improve load symmetry of switching stage 108 thereby increasing second and third order intercept point parameters of switching stage 108.

However, employing capacitors 156 coupled with a limited gain bandwidth product of op-amp 162 of load portion 104 may result in phase jumps (differences between phase characteristics in high gain and low gain modes) in output signal $V_{out}$, which is undesirable. In an example, in long term evolution (LTE) receivers, phase jumps smaller than 2 degrees are required.

Furthermore, such phase jumps depend on frequency and may not be compensated by known means, e.g. by CORDIC phase shifters in the digital back end of the receiver (not shown), with the receiver comprising system 100. As a consequence, error vector magnitude (EVM) performance metric of the receiver degrades considerably.

Altering Capacitance at Interface 110

The gain of system 100 is dependent upon a magnitude of an impedance of resistors 164. More specifically, the transfer function of the load portion 104 may expressed as:

$$TF(w) = \frac{V_{IF}(w)}{I_{IF}(w)} = \frac{G_o R_L}{\left(G_o - w^2 \frac{CR_L}{w_{op}}\right) + jw\left(\frac{G_o}{w_L} + CR_L\right)} \quad (1)$$

wherein $G_0$ is the DC open loop gain of op-amp 162, $w_{op}$ is the 3 dB corner frequency of loop characteristics of op-amp 162, and $w_L$ is the 3 dB corner frequency of the feedback network (resistors 164 and capacitors 166 connected in parallel). Further, $R_L$ is a magnitude of resistors 164, C is a magnitude of capacitors 156, w is an angular frequency (w=2×π×f; f is a normal frequency), and j is an imaginary unit.

Altering the magnitude of resistors 164 results in differing phase characteristics of output signal $V_{out}$ (while maintaining substantially the same magnitude of capacitors 156). To minimize, if not prevent, differences in phase characteristics between high and low gain modes of output signal $I_{out}$, and more specifically, minimizing, if not preventing phase jumps larger than 2 degrees, the product of the magnitude of capacitors 156 and the magnitude of resistors 164 may be substantially constant. Furthermore, the magnitude of capacitors 156 may be further defined as the total capacitance at interface 110.

To that end, to facilitate minimizing, if not preventing differences in phase characteristics of output signal $I_{out}$, system 100 follows the condition:

$$C \times R_L = \text{constant} \quad (2)$$

By keeping the product of the magnitude of the capacitance at interface 110 and the magnitude of resistors 164 substantially constant, phase jumps are minimized, and in a further implementation, phase jumps less than 2 degrees may be achieved.

To that end, to maintain the product of the capacitance at interface 110 and the magnitude of resistors 164 substantially constant while having the magnitude of resistors 164 being variable, the magnitude of capacitors 156 may be variable.

Figure 2:
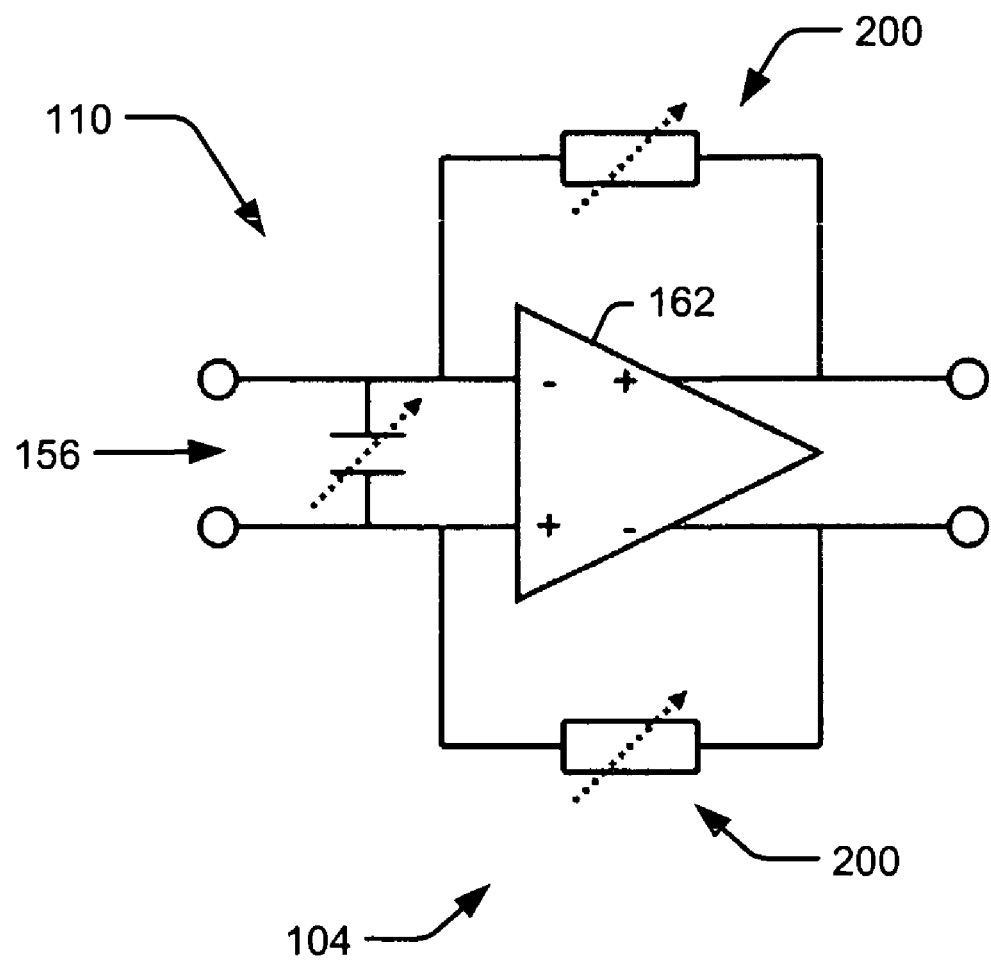
FIG. 2 shows the load module of FIG. 1 having variable resistors and an interface module of the mixer of FIG. 1 having a variable capacitor.

FIG. 2 shows load portion 104 and interface 110, with capacitors 156 being variable. Further, FIG. 2 shows resistors 164 and capacitors 166 as impedance module 200.

Figure 3:
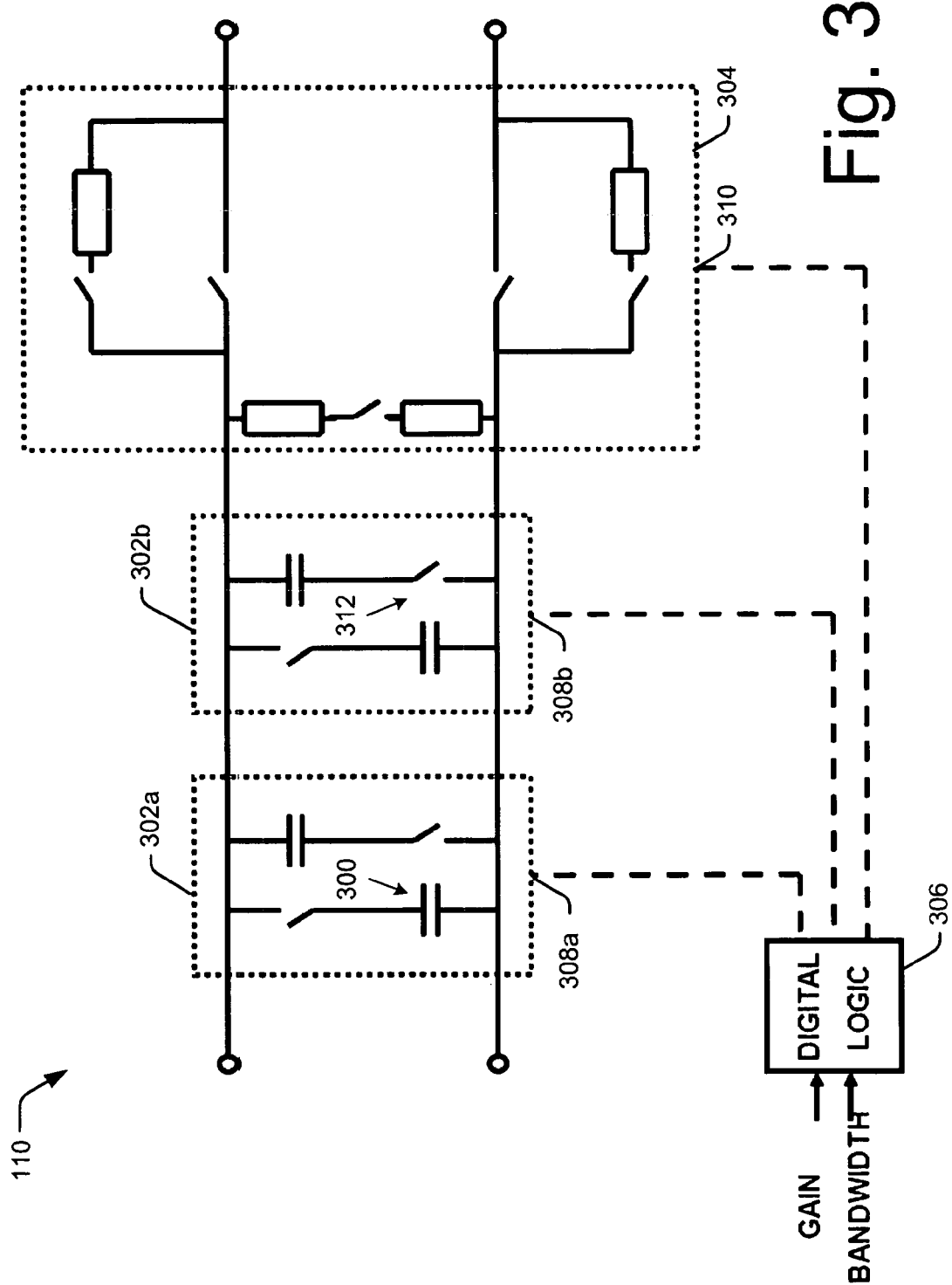
FIG. 3 shows a further implementation of an interface module of the mixer of FIG. 1.

FIG. 3 shows a further implementation of interface 110. More specifically, in addition to, or in lieu of, altering the magnitude of capacitors 156, shown in FIG. 1, system 100 may comprise additional capacitors 300 at interface 110 such that additional capacitors 300 may increase the total capacitance of interface 110 to facilitate maintaining the product of the capacitance at interface 110 and the magnitude of resistors 164 to be substantially constant. In a further implementation, the product of the capacitance at interface 110 and the magnitude of resistors 164 may have a tolerance of 50%.

To that end, in the further implementation of FIG. 3, interface 110 comprises capacitance modules 302a and 302b, resistance module 304, and digital logic module 306. Digital logic module 306 is connected to an input terminal 308 of capacitance modules 302 and an input terminal 310 of resistance module 304. Capacitance modules 302 comprise additional capacitors 300 connected to switches 312. As shown, capacitance modules 302 each comprise two capacitors 300; however, capacitance modules 302 may comprise any number of capacitors depending on the application desired. Further, each of additional capacitors 300 may have any magnitude of capacitance associated therewith. In an implementation, additional capacitors 300 of capacitance modules 302b are three times the magnitude of the additional capacitors 300 of capacitance module 302a. Resistance module 304 implements gain step only for GSM to maintain the corner frequency substantially the same in high and low gain modes.

To maintain the product of the capacitance at interface 110 and the magnitude of resistors 164 to be substantially constant in view of altering a magnitude of resistors 164, digital logic module 306 determines a capacitance needed such that equation (2) mentioned above, is satisfied. Digital logic module 306 selectively engages switches 312 such that a desired subset of additional capacitors 300 is connected between drain terminals 144 of transistors 140a/140c and drain terminals 144 of transistors 140b/140d, analogous to that mentioned above with capacitors 156.

Further Implementation of Load Portion 104

Figure 4:
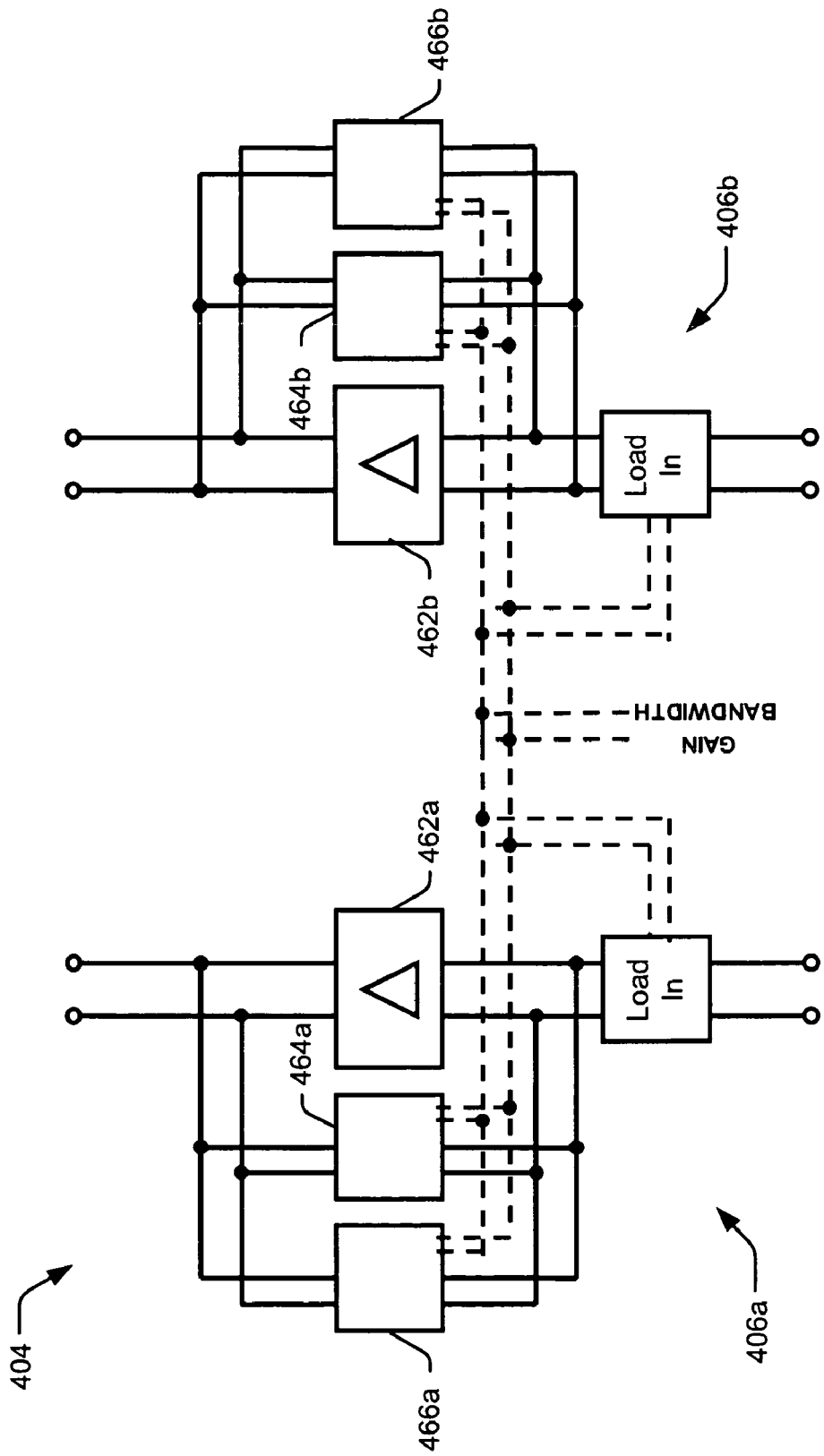
FIG. 4 shows a block diagram of the load module of FIG. 1 in implementation of a quadrature mixer.

FIG. 4 shows a further implementation of load portion 104, now defined as load portion 404. More specifically, load portion 404 comprises two substantially the same paths 406 for processing quadrature signals. Each path 406 comprises an op-amp 462, resistor module 464, and capacitor module 466, analogous to that mentioned above with respect to FIG. 1.

Furthermore, load portion 404 may be implemented when reference signal $V_{rf}$ is received via a communications network, as described above. To that end, values of resistor module 464 may be altered to obtain the required gain of system 100. Also, values of capacitor module 466 may be altered to set the required bandwidth of the given communications network.

Implementation Employing LTE 10 MHz Signal

In a further implementation, input voltage signal $V_{rf}$ is received via a LTE 10 MHz communications network. As such, it is desired to minimize, if not prevent, differences in phase characteristics between high and low gain modes of output signal $V_{out}$, and more specifically, minimize, if not prevent phase jumps larger than 2 degrees. However, employing equation (2) above may result in phase jumps larger than 2 degrees (however, the phase jumps still being reduced). To that end, for input voltage signal $V_{rf}$ being received via a LTE 10 MHz communication network, the capacitance at interface 110 is less than the magnitude of C determined by equation (2) above.

Process Model

Figure 5:
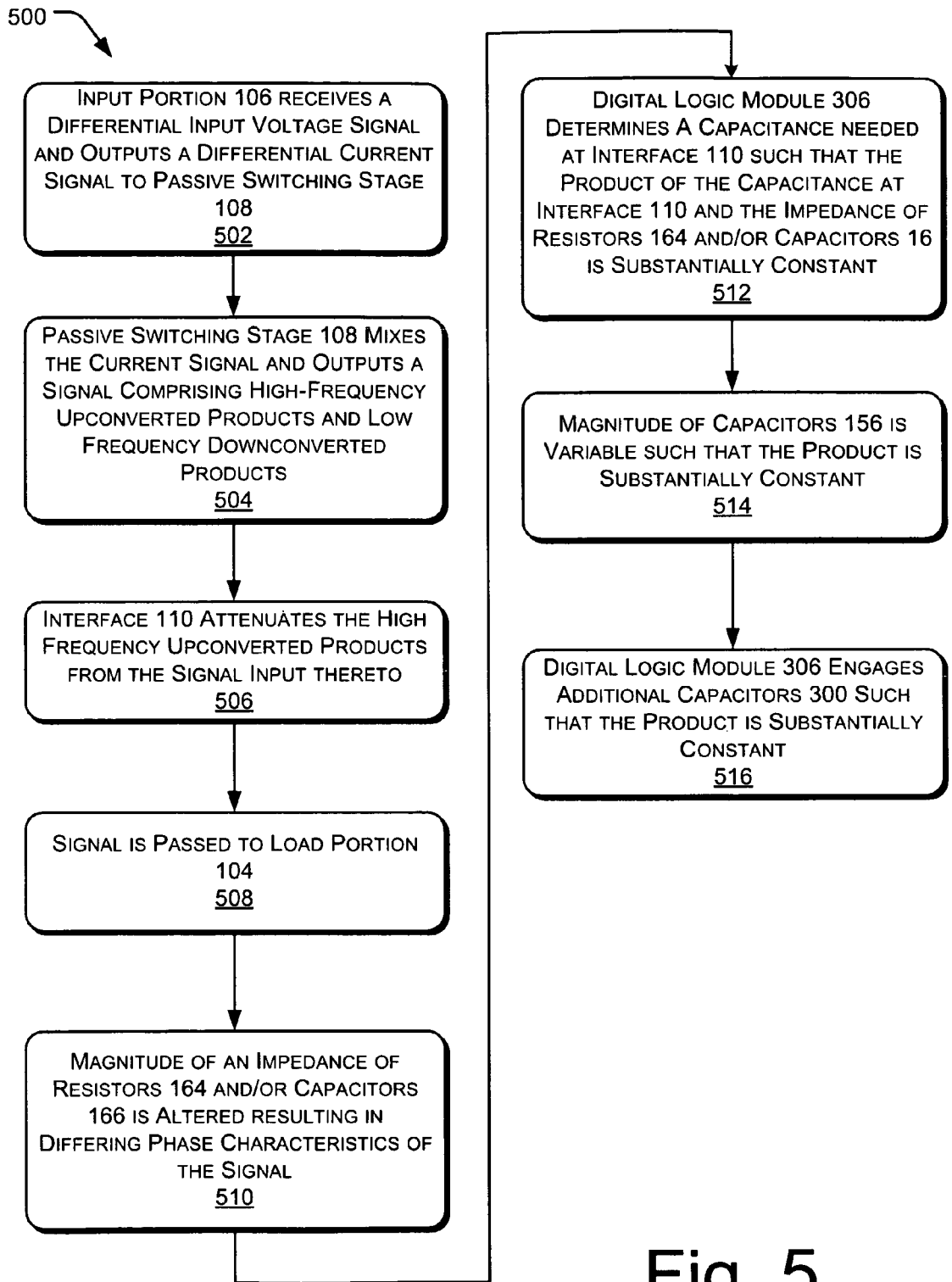
FIG. 5 is a process flow chart of employing the system of FIG. 1.

FIG. 5 shows a method 500 of employing system 100. The process 500 is illustrated as a collection of referenced acts arranged in a logical flow graph, which represent a sequence that can be implemented in hardware, software, or a combination thereof. The order in which the acts are described is not intended to be construed as a limitation, and any number of the described acts can be combined in other orders and/or in parallel to implement the process.

At step 502, input portion 106 of mixer portion 102 receives a differential input voltage signal and outputs a differential current signal to passive switching stage 108 of mixer portion 102.

At step 504, passive switching stage 108 mixes the current signal and outputs a signal comprising high-frequency upconverted products and low-frequency downcoverted products.

At step 506, interface 110 of mixer portion 102 attenuates the high-frequency upconverted products from the signal input thereto.

At step 508, the signal is passed to load portion 104. The load portion 1034 may include resistors 164 and/or capacitors 166.

At step 510, a magnitude of an impedance of the resistors 164 and/or capacitors 166 is altered resulting in differing phase characteristics of the signal.

At step 512, digital logic module 306 determines a capacitance at interface 110 needed such that the product of the capacitance at interface 110 and the magnitude of the impedance of resistors 164 and/or capacitors 166 may be substantially constant.

At step 514, the magnitude of capacitors 156 may be variable such that the product of the capacitance at interface 110 and the magnitude of the impedance of resistors 164 and/or capacitors 166 may be substantially constant At step 516, in addition to, or in lieu of step 514, digital logic module 306 selectively engages a desired subset of additional capacitors 300 such that the product of the capacitance at interface 110 and the magnitude of the impedance of resistors 164 and/or capacitors 166 may be substantially constant.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

What is claimed is:

1. A system for minimizing phase jumps in an output signal, the system comprising:

an input module to receive an input voltage signal and convert the voltage signal to a current signal, the input module outputting the current signal;

a switching stage to receive the current signal and output a first signal comprising high-frequency upconverted products and low-frequency downconverted products;

an interface, comprising at least one capacitor, to receive the first signal and attenuate the high-frequency upconvereted products while outputting a second signal comprising the low-frequency downconverted products;

a load module to receive the second signal, the load module comprising an operational amplifier and at least one variable resistance load, with the load module outputting the output signal, a gain of the system determined by an impedance of the variable resistance load; and wherein a product of a magnitude of the capacitor of the interface and a magnitude of the variable resistance load is substantially constant in view of varying the variable resistance load.

2. The system as recited in claim 1, wherein a magnitude of the phase jumps is less than 2 degrees.

3. The system as recited in claim 1, wherein the input voltage signal is received via a communications network, the network being selected form a group of networks comprising GSM, UMTS, and LTE (1.4 MHz, 3 MHz, 5 MHz, 10 MHz, 15 MHz, and 20 MHz).

4. The system as recited in claim 1, wherein the load module further comprises a capacitance load, wherein the impedance is further defined as an impedance of the variable resistance load and the capacitance load.

5. The system as recited in claim 1, wherein the input module comprises at least one transistor to convert the input voltage signal to the current signal.

6. The system as recited in claim 1, wherein the switching stage comprises a plurality of transistors coupled between the input module and the interface, with a control terminal of each of the plurality of transistors being connected to a local oscillator source.

7. The system as recited in claim 1, wherein the product of the magnitude of the capacitor and the magnitude of the variable resistance load has a tolerance of 50%.

8. A system for minimizing phase jumps in an output signal, the system comprising:

an input module to receive an input voltage signal and convert the voltage signal to a current signal, the input module outputting the current signal;

a switching stage to receive the current signal and output a first signal comprising high-frequency upconverted products and low-frequency downconverted products;

an interface, comprising at least one capacitor, to receive the first signal and attenuate the high-frequency upconvereted products while outputting a second signal comprising the low-frequency downconverted products, the interface further comprising an capacitance module comprising at least one additional capacitor;

a load module to receive the second signal, the load module comprising an operational amplifier and at least one variable resistance load, with the load module outputting the output signal, a gain of the system determined by an impedance of the variable resistance load; and a digital control module communicatively coupled with the interface, with the digital control module selectively engaging the additional capacitors such that a product of a magnitude of a total capacitance at the interface and a magnitude of the variable resistance load is substantially constant in view of varying the variable resistance load.

9. The system as recited in claim 8, wherein a magnitude of the phase jumps is less than 2 degrees.

10. The system as recited in claim 8, wherein the input voltage signal is received via a communications network, the network being selected form a group of networks comprising GSM, UMTS, and LTE (1.4 MHz, 3 MHz, 5 MHz, 10 MHz, 15 MHz, and 20 MHz).

11. The system as recited in claim 8, wherein the load module further comprises a capacitance load, wherein the impedance is further defined as an impedance of the variable resistance load and the capacitance load.

12. The system as recited in claim 8, wherein the input module comprises at least one transistor to convert the input voltage signal to the current signal.

13. The system as recited in claim 8, wherein the switching stage comprises a plurality of transistors coupled between the input module and the interface, with a control terminal of each of the plurality of transistors being connected to a local differential oscillator source.

14. The system as recited in claim 8, wherein the product of the magnitude of the capacitor and the magnitude of the variable resistance load has a tolerance of 50%.

15. A method of minimizing phase jumps in an output signal, the method comprising:
   receiving a input voltage signal and converting the voltage signal to a current signal;
   mixing the current signal by a mixer to generate a first signal comprising high-frequency upconverted products and low-frequency downconverted products;
   attenuating the high-frequency upconverted products by at least one capacitor to generate a second signal;
   passing the second signal to a load, comprising an operational amplifier and at least one variable resistance load, with a gain of the input voltage signal determined by an impedance of the variable resistance load;
   altering a magnitude of the resistance load; and
   selectively engaging additional capacitors such that a product of a magnitude of a total capacitance between the mixer and the load and a magnitude of the variable resistance load is substantially constant in view of varying the variable resistance load.

16. The method as recited in claim 15, wherein a magnitude of the phase jumps is less than 2 degrees.

17. The method as recited in claim 15, wherein the input voltage signal is received via a communications network, the network being selected form a group of networks comprising GSM, UMTS, and LTE (1.4 MHz, 3 MHz, 5 MHz, 10 MHz, 15 MHz, and 20 MHz).

18. The method as recited in claim 15, wherein the product of the magnitude of the capacitor and the magnitude of the variable resistance load has a tolerance of 50%.

19. The method as recited in claim 15, wherein the load further comprises a capacitance load.

20. The method as recited in claim 15, wherein converting further comprises at least one transistor converting the input voltage signal to the current signal.

\* \* \* \* \*